United States Patent [19]

Mealer, III et al.

[11] Patent Number: 4,761,549

[45] Date of Patent: Aug. 2, 1988

[54] A LINEAR PHOTO-RESPONSIVE CIRCUIT

[75] Inventors: Loyal D. Mealer, III, San Jose; Richard F. Lacey, Palo Alto, both of Calif.

[73] Assignee: Hewlett-Packard Company, Palo Alto, Calif.

[21] Appl. No.: 934,287

[22] Filed: Nov. 21, 1986

[51] Int. Cl.[4] .............................................. H01J 40/14
[52] U.S. Cl. ..................... 250/214 A; 330/308
[58] Field of Search .......... 250/214 A, 214 R, 214 C; 330/288, 289, 308, 252, 59; 307/311, 296 R

[56] References Cited

U.S. PATENT DOCUMENTS 4,284,960  8/1981  Ryan ................................... 330/308
4,314,152  2/1982  Fenk ................................ 250/214 R
4,565,974  1/1986  Smoot ................................. 330/308
4,584,052  4/1986  Ishii .................................... 330/308

Primary Examiner—David C. Nelms
Assistant Examiner—Jessica Ruoff
Attorney, Agent, or Firm—Paul L. Hickman; Edward Y. Wong

[57] ABSTRACT

Disclosed is a circuit to amplify a signal generated by the varying conductance of a photoconductor and to bias the photoconductance for optimum performance. A transistor means, with base input being proportional to the photoconductor's conductance and output being 180° out of phase with the input is coupled to an operational amplifier where said output is further amplified. Part of this inverted amplified output is then used to bias the photoconductor, immediately offsetting a changed voltage across the photoconductor and keeping voltage across the photoconductor constant.

5 Claims, 1 Drawing Sheet

A LINEAR PHOTO-RESPONSIVE CIRCUIT

FIELD OF INVENTION

The present invention relates to an improved circuit for generating an electrical signal whose amplitude varies linearly with the intensity of radiation incident upon a photodetector.

BACKGROUND OF THE INVENTION

A photoconductor's conductance varies linearly with the intensity of incident radiation upon the photoconductor. This change in conductance is used to create a change in current which is amplified to measure this incident radiation.

A photoconductor requires a certain bias voltage and current to operate in its linear region. Ideally, a constant voltage is fixed across the photoconductor so that any change in conductance would create a corresponding linear change in current through the photoconductor.

FIG. 1 illustrates the conventional method of biasing a photoconductor 103 and amplifying its signal. In this circuit a voltage 100 is supplied across two resistors 101, 102 connected in series with the photoconductor 103. Any change in the conductance of the photoconductor 103 would change the voltage across the photoconductor 103. Since the sum of resistors 101, 102 is large relative to the resistance of the photoconductor 103, a change in photoconductor conductance would not significantly change the bias current through it.

A capacitor 104 at the node between the series resistors 101, 102 decouples power supply noise and must be fairly large since voltage fluctuations from the power supply couple into the amplifier 110.

A capacitor 105 is used to couple an a.c. signal from the photoconductor 103 to a low impedance amplifier 110. This capacitor 105 must also be large to filter direct current and yet allow low frequency signals to pass into the amplifier 110 relatively unattenuated.

The drawbacks of this conventional biasing and amplifying circuit are: (1) the capacitors 104, 105 in the circuit must have a high capacitance and are therefore expensive and bulky; (2) the bias voltage changes with low frequency signals since, at low frequencies, the low impedance amplifier is no longer in parallel with the photoconductor due to the attenuation of the coupling capacitor 105; (3) when the photoconductor is removed, the decoupling and coupling capacitors 104, 105 charge up to the supply voltage 100 and could inject damaging surge currents into a photoconductor when it is inserted in the circuit; and (4) when the photoconductor responds to a large signal, the voltage across it drops, producing a nonlinear incremental response to additional radiation.

SUMMARY OF THE INVENTION

The present invention uses active devices to provide a stable bias condition for a photodetector to obtain a linear output signal from the photodetector. In the illustrated embodiment of the invention, a stable bias voltage across a photoconductor is provided for all signal frequencies without using large capacitors. Substantially all of the drawbacks of the conventional biasing and amplifying circuit of FIG. 1 are either obviated or resolved.

In the illustrated embodiment of the invention, a differential amplifier is used as a low noise front end amplifier whose output is fed into an operational amplifer. A small, fixed voltage forward biases the base-emitter junction of one transistor of the differential amplifier transistor pair. The other transistor has its base-emitter junction biased via a feedback loop.

The feedback loop consists of a resistor and the photoconductor connected in series between the output of the operational amplifier and ground potential. The ungrounded side of the photoconductor is connected to the base of this other transistor. If a photoresistor is used as the photodetector instead of a photoconductor, the resistor and photodetector positions in the feedback loop described above are exchanged. In this manner, the constant bias condition provided for the photoresistor takes the form of a constant current.

As the photoconductor draws more current in the illustrated embodiment of the invention, the voltage across the differential amplifier tends to decrease. Consequently, the voltage at the operational amplifier output is increased, and a constant voltage across the photoconductor is maintained.

DETAILED DESCRIPTION OF PREFERRED EMBODIMENT

Figure 1:
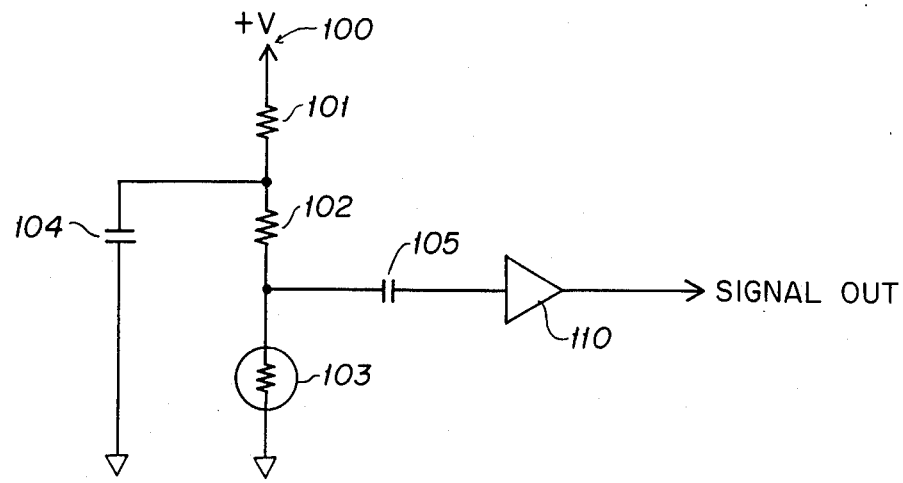
FIG. 1 shows the conventional circuit used to bias a photoconductor and amplify its signal.
Figure 2:
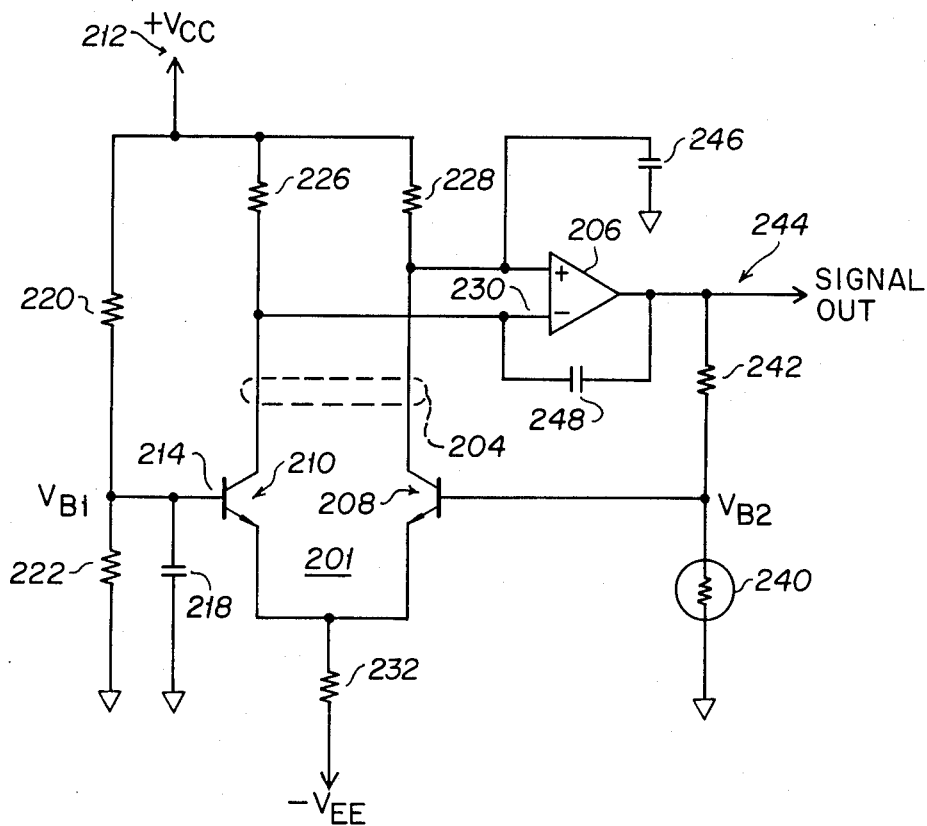
FIG. 2 is our improved biasing and amplifying circuit.

In the preferred embodiment of the present invention as illustrated in FIG. 2, a differential amplifier 201 acts as a low-noise, front-end amplifier whose output 204 is fed into an operational amplifier 206. A feedback loop connecting the output of the operational amplifier 206 with an input to the differential amplifier 201 helps to maintain a constant bias condition, viz., a fixed voltage, across a photoconductor 240. The change in the conductance of the photoconductor 240 creates a change in current through it; this current is fed into the base of the transistor 208 in the bias leg of the differential amplifier 201. This current change is amplified and used to measure radiation incident upon the photoconductor 240. In this manner, the circuit in accordance with the invention provides stable biasing conditions for a photoconductor. Additionally, it can be packaged as an inexpensive and small package. The circuit also has the added advantage of not imparting surge currents through an inserted photoconductor like the prior art.

A supply voltage 212 supplies collector voltage to the differential amplifier 201 and imparts a small voltage into the base 214 of a transistor 210 of the differential amplifier 201. This voltage is sufficient to forward bias the base-emitter junction and turn on the transistor 210. Resistors 220, 222 act as a voltage divider to supply the bias voltage for the transistor 210 at its base 214. A capacitor 218 acts to filter any noise from the power supply 212. This filter capacitor 218 can be small, since the value of the bias resistors 220, 222 can be high and the input impedance of the differential amplifier transistor 210 is high. Since the transistor 210 is turned on, a current flows from the supply voltage 212 through a collector resistor 226, creating a voltage drop across the resistor 226. The supply voltage 212 less this voltage drop appears at the collector of the transistor 210, and this resulting voltage is coupled to the inverting port 230 of the operational amplifier 206.

A voltage drop of approximately 0.7 volts across the base-emitter junction of the transistor 210 (assuming a silicon transistor) sets the voltage at the emitter of the transistor 210 at $V_{B1}$-0.7 v., where $V_{B1}$ is the voltage at its base. The common emitter resistor 232 is chosen so that an appropriate collector current would result from the emitter voltage set at the transistor 210.

The voltage input to the base of the transistor 208 is supplied by a voltage $V_{B2}$ present at the ungrounded side of photoconductor 240. The collector voltage at the collector resistor 228 of the transistor 208 is coupled to the noninverting port of the operational amplifier 206. The output of the operational amplifier 206 then varies with the differential voltage between the collectors of transistors 208 and 210. In turn, the base voltage $V_{B2}$ varies with the output 244 of the operational amplifier 206 because it is produced as a result of a divider network of a current-limiting resistor 242 and the photoconductor 240 in series across the output 244, thus creating a feedback loop to the operational amplifier 206 via the differential amplifier transistor 208. In a quiescent state the base voltage $V_{B2}$ is sufficient to forward bias the base-emitter junction of the transistor 208. The current feedback input into the base of the differential amplifier transistor 208 is determined by the current drawn through the photoconductor 240.

As radiation impinges on the photoconductor 240, its conductivity increases and more current is drawn through the photoconductor 240. This increased current results in a greater voltage drop across the photoconductor resistor 242 and consequently also at the base voltage $V_{B2}$ at the differential amplifier transistor 208. The transistor 208 is biased toward cutoff with the drop in the base voltage $V_{B2}$, and its collector voltage increases, thus increasing the voltage into the noninverting port of operational amplifier 206. The resulting voltage signal out of the operational amplifier 206 also increases to compensate for the additional voltage drop across the resistor 242, and via the feedback loop, offsetting any decrease in voltage $V_{B2}$ caused by the increased current through the photoconductor 240. This offsetting, due to the negative feedback, tends to keep the voltage across photoconductor 240 constant. In this manner, the bias condition of the photodetector, a photoconductor 240 in this case, is maintained in spite of varying intensity of radiation impinging on the photodetector.

Additional capacitors 246, 248 operate to lower the gain of the operational amplifier 206 at high frequencies add stability to the circuit.

If a photoresistive device were used instead of a photoconductive device, the positions of the photoconductor 240 and its resistor 242 would be interchanged to provide a constant current bias as the constant bias conditioning.

I claim:
1. A linear photo-responsive circuit comprising:
   a passive, linear, photo-responsive element having a feedback terminal, said photo-responsive element being biased such that it has a conductance or resistance which is substantially linearly responsive to incident radiation within a particular intensity range;
   a first differential amplifier having two input ports and two output ports, where a first of said input ports is coupled to said feedback terminal of said photo-responsive element to develop an amplified feedback signal at a first output port, and a second of said input ports is coupled to a constant voltage source to produce a differential voltage at a second output port; and
   a second differential amplifier having two input ports and an output port, where a first input port of said second differential amplifier is coupled to said first output port of said first differential amplifier, a second input of said second differential amplifier is coupled to said second output port of said first differential amplifier, and a signal output port of said second differential amplifier is coupled to said feedback terminal of said photo-responsive element such that said signal output is a substantially linear function of said incident radiation due to its feedback to said photo-responsive element.

2. A linear photo-responsive circuit as claimed in claim 1 wherein said first differential amplifier is a discrete transistor amplifier, where said first input port of said first differential amplifier is a base of a first transistor, said second input port of said first differential amplifier is a base of a second transistor, said first output port of said first differential amplifier is a collector of said first transistor, said second output port of said first differential amplifier is a collector of said second transistor, and where an emitter of said first transistor is coupled to an emitter of said second transistor.

3. A linear photo-responsive circuit as claimed in claim 1 wherein said second differential amplifier is an operational amplifier, where said first input port of said operational amplifier is non-inverting, and where said second input port of said operational amplifier is inverting.

4. A linear photo-responsive circuit as claimed in claim 1 wherein said photo-responsive element is a photoconductor having said feedback terminal coupled to said signal output port by resistance means, and having a second terminal coupled to ground.

5. A linear photo-responsive circuit as claimed in claim 1 wherein said photo-responsive element is a photoresistor having said feedback terminal coupled to ground by resistance means, an having a second terminal coupled to said signal output port.

* * * * *